United States Patent [19]
Cook et al.

[11] Patent Number: 4,897,606
[45] Date of Patent: Jan. 30, 1990

[54] METHOD AND APPARATUS FOR UNDESIRED GROUND PATH DETECTION IN A SINGLE-POINT GROUNDED ELECTRICAL SYSTEM

[75] Inventors: Richard W. Cook, Austin, Tex.; Dennis J. Hildenbrand, Morris Plains, N.J.

[73] Assignee: Board of Regents, University of Texas System, Austin, Tex.

[21] Appl. No.: 259,931

[22] Filed: Oct. 19, 1988

[51] Int. Cl.⁴ .............................................. G01R 31/02
[52] U.S. Cl. ..................... 324/509; 324/510; 324/511; 340/649
[58] Field of Search ................ 361/56, 62, 63, 64, 361/65; 340/649; 324/557, 509, 510, 511

[56] References Cited

U.S. PATENT DOCUMENTS

| | | |
|---|---|---|
| 3,783,340 | 1/1974 | Becker . |
| 3,875,506 | 4/1975 | Cath ........................ 324/64 |
| 3,956,639 | 5/1976 | Ramsay . |
| 4,159,501 | 6/1979 | White . |
| 4,417,202 | 11/1983 | Pascoe ........................ 324/509 |
| 4,429,338 | 1/1984 | Becker et al. . |
| 4,580,186 | 4/1986 | Parker et al. . |
| 4,679,111 | 7/1987 | Koch et al. . |
| 4,742,295 | 5/1988 | Nahman ........................ 324/510 |

FOREIGN PATENT DOCUMENTS

| | | | |
|---|---|---|---|
| 2236119 | 2/1974 | Fed. Rep. of Germany ...... 324/509 |
| 0125075 | 7/1984 | Japan ........................... 324/509 |
| 0748295 | 7/1980 | U.S.S.R. ........................ 324/509 |

Primary Examiner—Reinhard J. Eisenzopf
Assistant Examiner—Jose M. Jolis
Attorney, Agent, or Firm—Arnold, White & Durkee

[57] ABSTRACT

A method and apparatus for determining the existence of an undesired connection between an electrical system and a desired single-point ground. The electrical system is first disconnected from the desired single-point ground, and is connected to the center point of a resistive divider connected to an isolated voltage source. The voltage of the center point of the resistive divider is monitored and an indication is provided if the monitored voltage indicates the existence of undesired ground paths. The invention also includes elements for measuring the resistance value of a detected undesired ground path, thereby facilitating identification and removal thereof. The invention also includes a voltage clamp which is placed between the electrical system and the desired single-point ground when the electrical system is disconnected from the single-point ground. This voltage clamp provides personnel protection during undesired ground path detection so that, if a power line fault to ground occurs, the electrical system is still protected.

12 Claims, 2 Drawing Sheets 4,897,606

METHOD AND APPARATUS FOR UNDESIRED GROUND PATH DETECTION IN A SINGLE-POINT GROUNDED ELECTRICAL SYSTEM

FIELD OF INVENTION

The invention relates to a method and apparatus for the detection of undesired ground paths in single-point grounded electrical systems.

BACKGROUND OF THE INVENTION

In some electrical systems, particularly sensitive electrical instrumentation and diagnostic systems, electrical grounding is difficult without introducing electrical noise into the system. If individual portions of the sensitive electrical instrumentation and diagnostic system are grounded at physically different points, so-called ground loops exist. Rapidly changing electromagnetic fields present near the sensitive electrical instrumentation couple the ground loops and can momentarily elevate different portions of the grounded circuit to different electrical potentials, thereby introducing electrical noise into the sensitive electrical instrumentation and degrading measurement sensitivity and accuracy.

A known solution to the problem caused by ground loops is to insure that all portions of the sensitive electrical instrumentation are grounded at a single common point. While establishing such a single-point ground is simple in concept, it is difficult in practice particularly where many test devices of a test system are powered from separate AC power lines, or where many data signal lines are applied to the electrical instrumentation system. In addition, since such sensitive electrical instrumentation is often enclosed within a grounded electromagnetic interference shielded enclosure or screen room, the potential for establishing ground paths other than the desired single-point ground is increased. If an electrical instrumentation system is enclosed in a grounded electromagnetic interference shielding enclosure and requires tens or hundreds of electrical connections prior to operation, the existence of a single undesired ground point can greatly affect measurements. Such undesired ground paths may also be introduced when the electrical instrumentation system is assembled or expanded.

SUMMARY OF THE INVENTION

The method and apparatus of the present invention allows simple determination of the existence of undesired ground paths in a single point grounded system, thereby insuring accurate noise-free electrical data acquisition.

The present invention disconnects a grounded electrical system from a desired single-point ground, and applies a small electrical potential to the disconnected ground of the electrical system. If the electrical resistance of the electrical system to the desired single-point ground is below a predetermined value, the existence of an undesired ground path is concluded, and investigation and removal thereof can then proceed.

The invention also includes a voltage clamp which is always connected between the electrical system and the desired single-point ground in order to eliminate the possibility of a hazardous condition during testing for undesired ground paths. The voltage clamp network absorbs any over-voltage occurring on the disconnected ground with respect to the desired single-point ground, and is capable of carrying enough current to cause circuit breakers in power lines supplying the system to protect personnel in the event of a ground fault.

Also provided is the capability of measuring the resistance of any detected undesired ground path, and the capability of testing the voltage clamp network to verify proper function.

The apparatus and method of the invention includes a hard-ground switch connected between an electrical system and a desired single-point ground. The hard-ground switch is preferably timed so that it cannot inadvertently be left closed for long periods of time. When the hard-ground switch is open, the center point of a resistive divider bias network is applied to the disconnected ground of the electrical system, and the voltage of the center point is detected. From the detected voltage, it is concluded whether or not an undesired ground path exists. If so, appropriate warnings, for example, audible horns, flashing lights, or the like, are provided.

In parallel with the hard-ground switch is a voltage clamp network which provides hazard protection when the hard-ground switch is open. The voltage clamp network preferably comprises high current rectifiers connected in parallel, anode-to-cathode and cathode-to-anode. The clamp voltage of the voltage clamp network is greater than the bias voltage applied by the bias network, yet low enough to provide adequate personnel protection in the presence of a power line fault to ground in the monitored electrical system. Thus, detection of undesired ground paths is possible while maintaining a high degree of personnel safety.

Also provided is a test network which allows direct measurement of the value of the resistance or leakage current of an undesired ground path, and a tester for the voltage clamp to verify its proper operation.

DESCRIPTION OF THE PREFERRED EMBODIMENT

Figure 1:
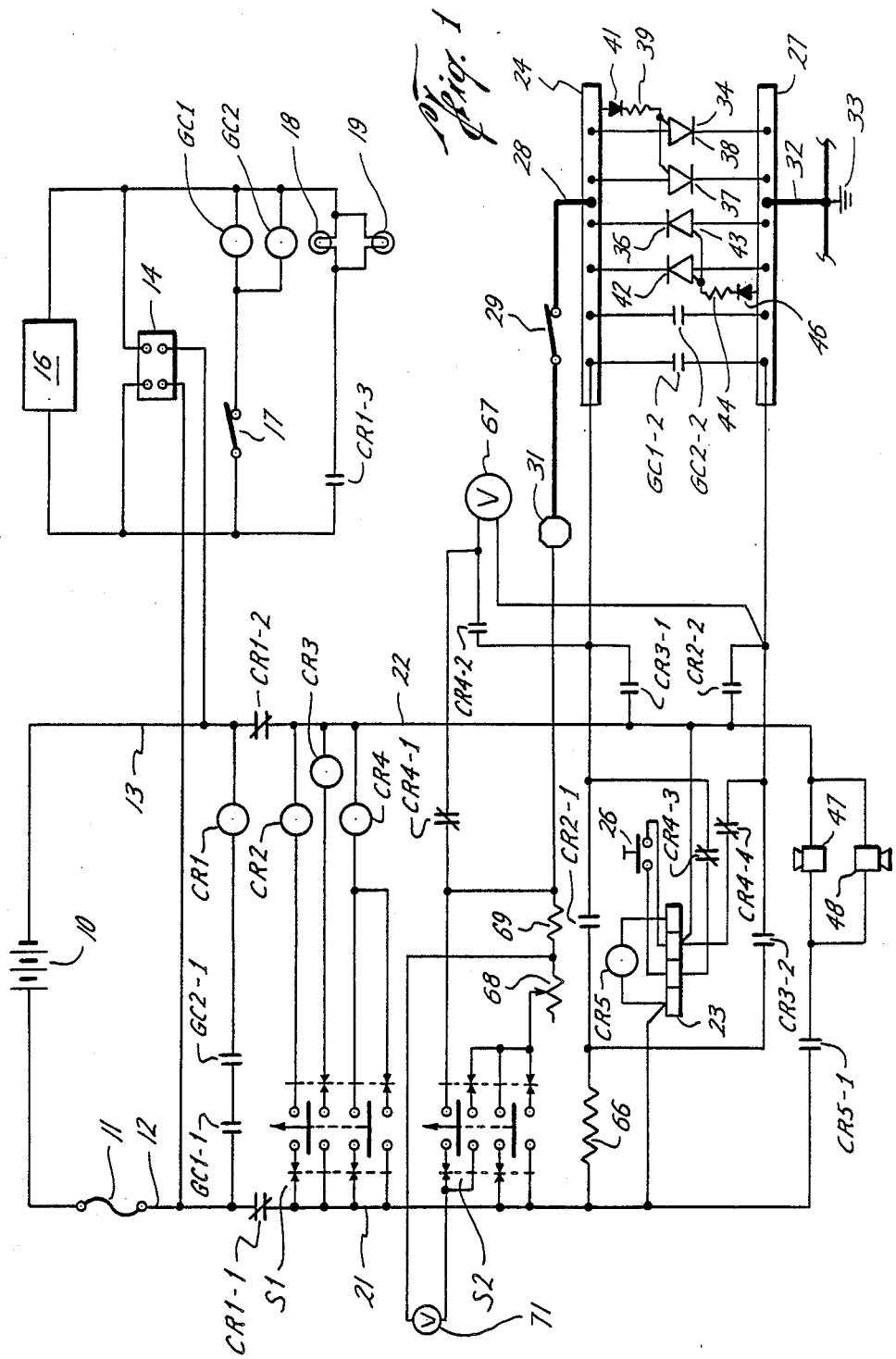
FIG. 1 is an electrical schematic of the present invention.

Referring to FIG. 1, the ground path tester and testing method of the present invention is described as applied to a screen room.

The tester is powered by a battery 10 which can be, for example, a chargeable 12-volt lead-acid battery. The positive terminal of battery 10 is connected through fuse 11 to line 12, and the negative terminal of battery 10 is connected to line 13. Also connected to lines 12 and 13 are the output terminals of battery trickle charger 14 which maintains a charge on battery 10. Battery trickle charger 14 is powered, for example, from a 120 VAC uninterruptible power source 16.

Also connected across uninterruptible power source 16 are switch 17 connected in series with parallel connected ground contactor relays GC1 and GC2. Switch 17 is preferably a normally-open timer actuated switch which, after closing, opens after a predetermined time delay, for example, sixty minutes. Ground contactor relays GC1 and GC2 have high current contacts GC1-2 and GC2-2 capable of carrying substantial amounts of current which can occur during, for example, a power line fault to ground. Ground contactor relays GC1 and GC2 also have contacts GC1-1 and GC2-2 which are connected in series with ground path tester disable relay CR1. When switch 17 is closed, ground contactor relays GC1 and GC2 are energized, thereby closing normally-open contacts GC1-1, GC2-1, GC1-2 and GC2-2 energizing test circuit disable relay CR1 and providing a hard ground connection between bus bars 24 and 27. Ground contactor relays GC1-1 and GC2-2 are preferably 40 Amp type, NEMA size 2 relays available from Square D Corporation. These contactors are sized to meet the ground fault current demands of the particular electrical system.

Figure 3:
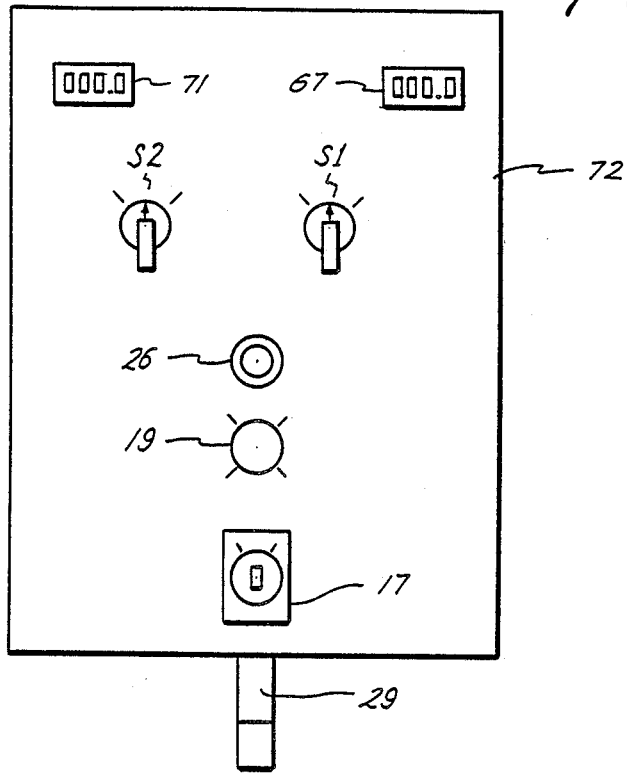
FIG. 3 is a panel face of the present invention.

When both of contacts GC1-1 and GC2-1 are closed, ground path tester disable relay CR1 is energized, thereby opening normally closed relay contacts CR1-1 and CR1-2, and removing power supplied by battery 10 from the remainder of the ground path tester circuit effectively disabling the ground path tester circuit. In addition, energization of ground path tester disable relay CR1 closes normally open relay contact CR1-3 thus lighting ground indicator lamps 18 and 19. Indicator lamp 18 is preferably visible within the grounded screen room whereas indicator lamp 19 is preferably visible from the face of a test circuit control panel (FIG. 3). When lit, lamps 18 and 19 indicate that the manual timed hard ground between bus bars 24 and 27 is active.

If ground path tester disable relay CR1 is not energized, power is applied from battery 10, through lines 12 and 13 and normally closed relay contacts CR1-1 and CR1-2, to ground path tester power line 21 and ground path tester ground line 22, thereby providing power to the components of the tester circuit.

The ground path tester circuit includes four terminal voltage bias and detecting circuit 23, the circuit details of which are described below with reference to FIG. 2. Terminal A of voltage bias and detecting circuit 23 is connected to tester power line 21 and is also connected to one terminal of horn relay CR5. The other terminal of horn relay CR5 is connected to terminal D of voltage bias and detecting circuit 23. Terminal B of voltage bias and detecting circuit 23 is connected, through normally closed relay contact CR4-3 to bus bar 24, and is also connected to one terminal of horn test switch 26. The other terminal of horn test switch 26 is connected to terminal C of voltage bias and detecting circuit 23, which is also connected to tester ground line 22 and, through normally closed relay contact CR4-4, to bus bar 27.

Bus bars 24 and 27 are preferably aluminum bus bars capable of handling large currents which may occur during a ground fault. In the preferred embodiment, bus bars 24 and 27 are 2.5 × 7.5 × 25.5 cm aluminum bars. Bus bar 24 is connected through heavy gauge cable 28 and switch 29 to a screen room (not shown) through screen room connection 31. Switch 29 is preferably a 400 Amp manual disconnect switch which is spring biased normally closed and is located on the tester panel (FIG. 3). Bus bar 27 is connected through heavy gauge cable 32 to desired single-point ground 33.

Also connected across bus bars 24 and 27 are personnel protection devices 34 and 36. Personnel protection device 34 includes a pair of silicon controlled rectifiers (SCRs) 37 and 38 having anodes connected in common to bus bar 24 and cathodes connected in common to bus bar 27. The gates of SCRs 37 and 38 are connected in common and are connected to bus bar 24 through resistor 39 and diode 41. Similarly, personnel protection device 36 comprises SCRs 42 and 43 having anodes connected in common and to bus bar 27 and cathodes connected in common and to bus bar 24. The gates of SCRs 42 and 43 are connected in common and are connected to bus bar 27 through resistor 44 and diode 46.

Personnel protection devices 34 and 36 act as a bipolar voltage clamp to limit the maximum possible voltage between bus bars 24 and 27 when ground contacts GC1-2 and GC2-2 are open, which occurs during ground path testing. In the preferred embodiment, SCRs 37, 38, 42, and 43 are type S30EF silicon controlled rectifiers available from International Rectifier, or sized to meet the fault current demand. SCRs 37, 38, 42, and 43 of personnel protection devices 34 and 36 could be replaced by high-current diodes, for example, type R77R6A diodes available from International Rectifier, or similarly functioning devices, as long as the bipolar voltage clamping function is maintained. The clamping voltage of personnel protection devices 34 and 36 is small enough to afford personnel protection should a power line to ground fault occur during ground path testing, yet large enough so as not to interfere with the ground path testing operation, described in detail below. In the disclosed embodiment, the clamp voltage is approximately 0.7 Volts.

When horn relay CR5 is energized by voltage bias and detecting circuit 23, relay contact CR5-1 closes, thereby energizing warning horns 47 and 48. It will be understood that warning horns 47 and 48 could be replaced by similar aural devices or other warning devices such as warning lights, and the like, or any combination thereof. Horn 47 is preferably audible in the grounded screen room whereas horn 48 is preferably audible in a laboratory where experiments are being conducted and monitored by instrumentation within the screen room.

Figure 2:
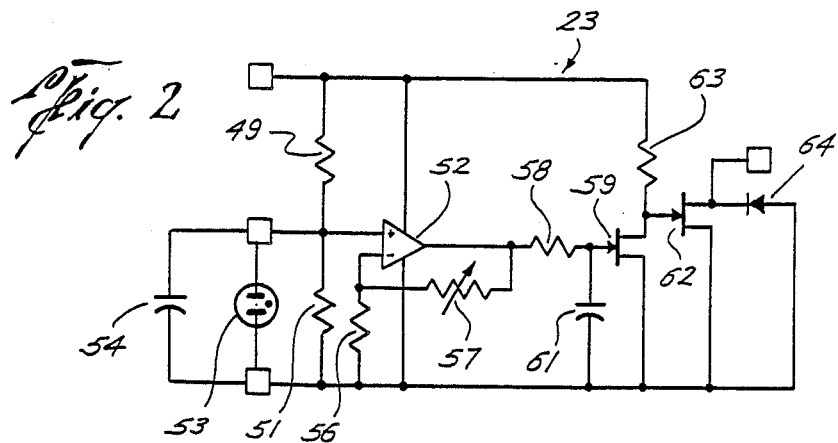
FIG. 2 is an electrical schematic of a voltage bias and detecting circuit used in FIG. 1.

Referring now to FIG. 2, a detailed description of voltage bias and detecting circuit 23 of FIG. 1 is provided. Terminal A is connected through a resistive divider including resistors 49 and 51 to terminal C of circuit 23. The intermediate point of the resistive divider including resistors 49 and 51 is connected to terminal B of circuit 23 and to the non-inverting input of operational amplifier 52. Operational amplifier 52 is preferably a type LM324 operational amplifier available from The National Semiconductor Corporation. Power and ground are provided for operational amplifier 52 through terminals A and C of circuit 23. Also connected across terminals B and C of circuit 23 are neon lamp 53 and filter capacitor 54.

The inverting input of operational amplifier 52 is connected, through resistor 56, to terminal C of circuit 23, and is also connected to the output of operational amplifier 52 through variable resistor 57, thereby providing gain adjustment for operational amplifier 52. The output of operational amplifier 52 is connected, through resistor 58 to the gate of field effect transistor (FET) 59. The source of FET 59 is connected to terminal C of circuit 23, and capacitor 61 is connected between the gate and source of FET 59. Capacitor 61 and resistor 58 form a low-pass filter circuit which rejects an alarm response to intermittent nuisance faults. The drain of FET 59 is connected to the gate of FET 62, and is connected, through resistor 63 to terminal A of circuit 23. The drain of FET 62 is connected to terminal D of circuit 23 and to the cathode of diode 64. The anode of diode 64 and the source of FET 62 are each connected to terminal C of circuit 23. FETs 59 and 62 can be, for example, type RPF-15N06 field effect transistors available from General Electric.

Having thus described the fundamental elements of the present invention, the operation thereof will be described. With reference to FIGS. 1 and 2, when switch 17 is closed, ground contactor relays GC1 and GC2 are each energized, thereby energizing ground path tester disable relay CR1 which removes power from, and effectively disables, the tester circuit. In addition, energization of ground contactor relays GC1 and GC2 closes high current contacts GC1-2 and GC2-2, thereby providing a hard single-point ground for the electrical system, for example, screen room.

When timed switch 17 is opened, ground contactor relays GC1 and GC2 are de-energized, thereby de-energizing ground path tester disable relay CR1 which, in turn, connects battery 10 to the tester circuit. Also, high current contacts GC1-2 and GC2-2 are opened leaving only personnel protection devices 34 and 36 to clamp the voltage between bus bars 24 and 27.

When power is applied to voltage bias and detecting circuit 23, terminals B and C apply a voltage between screen room connection 31 and single-point ground 33 through normally closed relay contact CR4-3, bus bar 24, cable 28, switch 29, normally closed relay contact CR4-4, bus bar 27, and cable 32. This voltage is preferably approximately 0.3 Volts which is less than the forward conducting voltage of personnel protection devices 34 and 36.

Also connected across terminals B and C of circuit 23 is neon lamp 53 which serves as a voltage clamp between terminals B and C of circuit 23, thereby protecting the input of operational amplifier 52. Capacitor 54 placed across terminals B and C of circuit 23 serves to filter electrical noise which may cause false alarms.

Variable resistor 57 is adjusted so that operational amplifier 52 provides a bias voltage of approximately three volts to the gate of FET 59, thereby insuring that FET 59 is on, which causes FET 62 to be off, when no undesired paths exist between terminals B and C of detecting circuit 23, i.e., when screen room connection 31 contains no undesired paths to single-point ground 33.

If, however, such an undesired ground path exists, thereby creating an undesired ground loop, the voltage at terminal B of circuit 23 will drop which, in turn, will drop the voltage applied to the gate of FET 59. When the voltage on the gate of FET 59 drops below the FET threshold voltage, FET 59 turns off and FET 62 turns on, thereby energizing horn relay CR5 and sounding horns 47 and 48.

The values of resistors 49 and 51 are determined by the level of the desired bias voltage, the magnitude of the voltage provided by battery 10, and the minimum resistance value of the undesired ground path to be detected. In the disclosed embodiment, the desired bias voltage is less than the clamp voltage of personnel protection devices 34 and 36 (0.7 Volts). When a ground path occurs of resistance less than or equal to the value of resistor 51, this will cause the voltage appearing on the non-inverting input of operational amplifier to be halved, and operational amplifier 52 will turn off FET 59. In the preferred embodiment, resistor 49 is 100 kilo Ohms and resistor 51 is 4.7 kilo Ohms. Variable resistor 57 is adjusted so that when an undesired ground path exists between terminals B and C of circuit 23 having a resistance less than approximately 4.7 kilo Ohms, FET 59 will turn off and FET 62 will turn on. Thus, the present invention is capable of detecting relatively high resistance undesired ground paths.

If testing of the operation of horns 47 and 48 is desired, horn test button 26 is depressed, thereby short circuiting terminals B and C of circuit 23 and simulating an undesired ground path.

The present invention also includes elements for testing the integrity of personnel protection devices 34 and 36, and for determining the resistance of an undesired ground path, thereby facilitating its location and removal.

Referring to FIG. 1, protection test selector switch S1 can be positioned to test either personnel protection device 34 or 36. Switch S1 is a double-pole/double-throw switch with a center neutral position. When personnel protection device testing is not desired, switch S1 remains in the center (neutral) position depicted in FIG. 1. When testing of the function of personnel protection device 34 is desired, switch S1 is moved to the left which causes the movable contacts of switch S1 to rise. This energizes plus device test relay CR2 and detecting circuit input disable relay CR4. Energization of detecting circuit input disable relay CR4 opens normally closed contacts CR4-3 and CR4-4 effectively disconnecting voltage bias and detecting circuit 23 from screen room connection 31. In addition, relay contact CR4-1 is opened and relay contact CR4-2 is closed. Also, when plus device test relay CR2 is energized, relay contact CR2-1 and CR2-2 are closed. This combination of relay contacts connects bus bar 24 to tester voltage supply line 21 through resistor 66 and connects bus bar 27 to tester supply ground line 22, thereby forward biasing personnel protection device 34. In addition, voltmeter 67 is placed across bus bars 24 and 27. Thus, voltmeter 67 measures the voltage across forward biased personnel protection device 34 and it can be determined whether device 34 is properly functioning.

In a similar manner, if testing of personnel protection device 36 is desired, switch S1 is moved to the right which causes the movable contacts of switch S1 to lower, thereby energizing minus device test relay CR3 and energizing detecting circuit input disable relay CR4. When energized, detecting circuit input disable relay CR4 and its contacts operate identically with the above-described operation, and energization of minus device test relay CR3 closes relay contacts CR3-1 and CR3-2, thereby connecting tester circuit voltage supply line 21 to bus bar 27 through resistor 66, and connecting test circuiter ground line 22 to bus bar 24. Thus, personnel protection device 36 is forward biased, and the voltage across personnel protection device 36 is measured by voltmeter 67.

In addition, since determination of the resistance value of an undesired ground path is often helpful in identifying the cause of the undesired ground path, the present invention also includes provisions for measuring the resistance of the undesired ground path.

If it is known that the resistance of an undesired ground path is low, corresponding to a high leakage current, spring biased high current disconnect 29 is opened and current measure selector switch S2 is moved to the left. This causes the movable contacts of switch S2 to rise, thereby connecting screen room connection 31 to tester circuit power line 21 through the series combination of potentiometer 68 and resistor 69, and connects voltmeter 71 across resistor 69. Resistor 69 is preferably a low resistance shunt on the order of 0.005 Ohm which produces a 50 mV voltage when a 10

Amp current passes therethrough. Thus, the voltage measured by voltmeter 71 is directly convertible to current passing through resistor 69, and passing through the undesired ground path of unknown value. In addition, voltmeter 67 is placed between screen room connection 31 and single-point ground 33 and measures the voltage across the undesired ground path. From the voltage indicated by voltmeter 67 and current indicated by voltmeter 71, the resistance of the undesired ground path can be calculated.

Should the resistance of the undesired ground path be a high value, corresponding to a low leakage current, switch S2 is moved to the right which causes the movable contacts of switch S2 to lower, thereby producing a function identical to that described above, except that voltmeter 71 is placed between the wiper and one end of potentiometer 68. Potentiometer 68 is of a higher resistance value than shunt resistor 69 and has been previously adjusted in order to calibrate current measurements. Once again, the current through the undesired ground path is indicated by voltmeter 71, and the voltage across the undesired ground path is determined by voltmeter 67. The resistance value of the undesired ground path can then be calculated.

Referring to FIG. 3, a preferred panel face 72 for the present invention is shown. Meters 67 and 71 are located near the top of panel 72 Selector switches S1 and S2, horn test button 26, indicator lamp 19, and timed switch 17 are all located on the face of panel 72. High current manual disconnect switch 29 is readily accessible near the bottom of panel 72.

While the present invention has been described with reference to a preferred embodiment, it will be understood that the disclosed preferred embodiment is by way of example only, and not by way of limitation. For example, although the present invention has been described as applied to a grounded screen room, it is equally useful with any single-point grounded electrical system that may be affected by the existence of undesired ground paths.

We claim:

1. An apparatus for testing a single-point earth grounded electrical system, comprising:
   an electrical switch for selectively connecting and disconnecting a common grounding point of an electrical system to and from a desired single-point earth ground;
   a voltage clamp connected in parallel with said electrical switch, a clamp voltage and a current carrying capacity of said voltage clamp being sized to ensure personnel protection from electrical shock when said common grounding point is disconnected from said desired single-point earth ground;
   means, electrically referenced to said desired single-point earth ground, for connecting a source of electrical current to said common grounding point when said common grounding point is disconnected by said switch from said desired single-point earth ground;
   means for monitoring an electrical potential of said common grounding point relative to said desired single-point earth ground due to said source of electrical current; and
   means for indicating the existence of at least one undesired connection between said common grounding point and said desired single-point earth ground based on monitored electrical potential of said common grounding point.

2. The apparatus of claim 1 wherein said voltage clamp includes at least one high current rectifier.

3. The apparatus of claim 2 wherein said voltage clamp includes first and second high current rectifiers, a cathode of said first rectifier being connected to an anode of said second rectifier, and an anode at said first rectifier being connected to a cathode of said second rectifier.

4. The apparatus of claim 1 further comprising means for measuring said clamp voltage of said voltage clamp.

5. The apparatus as recited in claim 1 wherein said means for connecting said source of electrical current comprises:
   a voltage source referenced to said desired single-point earth ground;
   a first resistor connected between said voltage source and said common grounding point; and
   a second resistor connected between said common grounding point and said desired single-point earth ground.

6. The apparatus as recited in claim 1 further comprising means for measuring a resistance value of said at least one undesired connection.

7. The apparatus as recited in claim 6 wherein said means for measuring a resistance value comprises:
   a voltage source referenced to said desired single-point earth ground;
   a resistor connected between said voltage source and said common grounding point;
   means for measuring current passing through said resistor; and
   means for measuring an electrical potential of said common grounding point relative to said desired single-point earth ground.

8. A method for determining the existence of at least one undesired ground path in a single-point earth grounded electrical system, including the steps of:
   providing an electrical system having a common grounding point connected to a desired single-point earth ground;
   selectively connecting and disconnecting said common grounding point from said desired single-point earth ground;
   clamping a voltage between said common grounding point and said desired single-point earth ground to a voltage level and with a current capacity to afford personnel protection from electrical shock when said common grounding point is disconnected from said desired single-point earth ground;
   applying a source of electrical current between said common grounding point and said desired single-point earth ground;
   measuring a voltage of said common grounding point relative to said desired single-point earth ground;
   determining from said voltage the existence of a least one undesired electrical path between said common grounding point and said desired single-point earth ground; and
   providing an alarm of the existence of said at least one undesired electrical path.

9. The method of claim 8 wherein said applying step includes the steps of connecting a first resistor between a source of voltage and said common grounding point; and
   connecting a second resistor between said common grounding point and said desired single-point earth ground.

10. The method of claim 8 wherein said alarm is aural.

11. The method of claim 8 wherein said alarm is visual.

12. The method of claim 8 further comprising the step of measuring a resistance value of said at least one undesired electrical path.

* * * * *